United States Patent [19]
Buchholz

[11] Patent Number: 4,568,884
[45] Date of Patent: Feb. 4, 1986

[54] CIRCUIT ARRANGEMENT COMPRISING AN AMPLIFIER AND AN ELECTRONIC SELECTOR SWITCH

[75] Inventor: Werner Buchholz, Lauf, Fed. Rep. of Germany

[73] Assignee: U.S. Philips Corporation, New York, N.Y.

[21] Appl. No.: 620,370

[22] Filed: Jun. 14, 1984

[30] Foreign Application Priority Data

Jun. 14, 1983 [DE] Fed. Rep. of Germany ....... 3321354

[51] Int. Cl.⁴ ............................................. G01R 1/00
[52] U.S. Cl. ....................................... 330/51; 328/154
[58] Field of Search ................... 330/51, 10; 307/243; 370/110.1; 328/104, 152, 154

[56] References Cited

FOREIGN PATENT DOCUMENTS 136157 10/1979 Japan ................................... 330/51

Primary Examiner—James B. Mullins
Assistant Examiner—G. Wan
Attorney, Agent, or Firm—Thomas A. Briody; William J. Streeter; Edward W. Goodman

[57] ABSTRACT

In a circuit arrangement comprising an amplifier and an electronic selector switch at the input of the amplifier it is possible to switch the input to one out of a plurality of incoming transmission paths. The operating current for the electronic selector switch is taken from the output of the amplifier through a negative feedback resistor.

12 Claims, 1 Drawing Figure

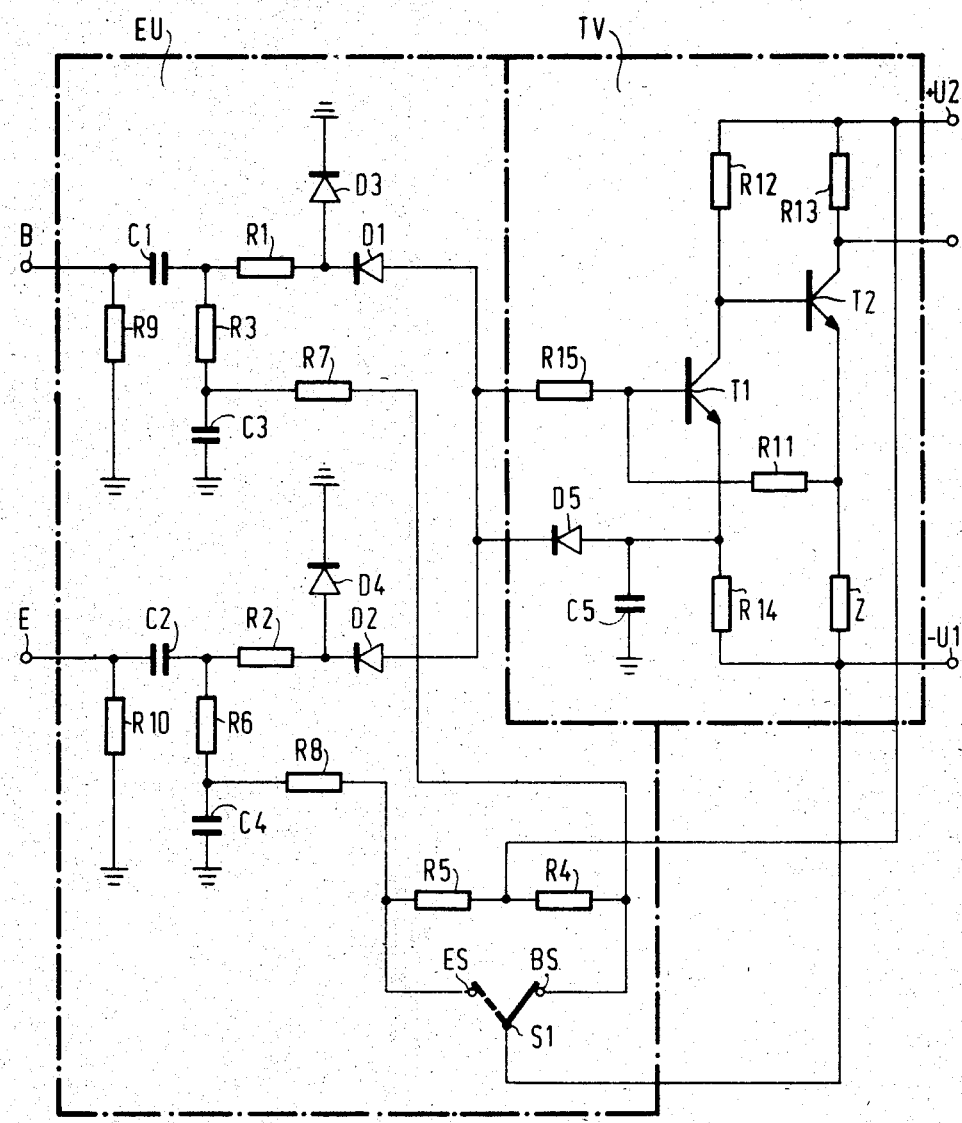

CIRCUIT ARRANGEMENT COMPRISING AN AMPLIFIER AND AN ELECTRONIC SELECTOR SWITCH

BACKGROUND OF THE INVENTION

The invention relates to a circuit arrangement comprising an amplifier and an electronic selector switch at the input of an amplifier for switching to one out of a plurality of transmission paths.

In Dietrich Elias, "Telekommunikation in der Bundesrepublik Deutschland 1982", R. v. Decker's Verlag, G. Schenck, Heidelberg, Hamburg, 1982, pages 206–208, a line terminating unit for a PCM-transmission system is described. The line terminating unit comprises an automatically controlled interface amplifier which equalizes the incoming distorted PCM signals. The attenuation on the line may be up to 12 dB at 70 MHz. An electronic selector switch, which can be controlled either manually or remotely, is provided at the input of the interface amplifier so as to ensure that when required, a switch from the operating line to a substitute line can be made.

SUMMARY OF THE INVENTION

The invention has for its object to provide a circuit arrangement comprising an amplifier and an electronic selector switch at the input of the amplifier for switching to one out of a plurality of transmission paths, which circuit arrangement requires only a small amount of active and passive components in view of the demanding high operating reliability, has a low power consumption and is particularly suitable for realization in hybrid techniques.

According to the invention this object is accomplished in that the operating current for the electronic selector switch is taken from the output of the amplifier through a feedback resistor.

DESCRIPTION OF THE DRAWING

Further objects and features of the invention will be more fully appreciated from the following description of an exemplary embodiment when considered in conjunction with the accompanying drawing, in which the FIGURE shows an embodiment for switching to one out of two transmission paths.

DESCRIPTION OF THE PREFERRED EMBODIMENT

In the embodiment shown in the FIGURE, the input from the two transmission paths are denoted by B and E. A cable is connected to each input B and E, which cable is used as the transmission medium.

First the electronic selector switch EU and thereafter the two-stage transistor amplifier TV will be described.

The input B is connected to a reference potential (ground) through a resistor R9 and, parallel thereto, through a series arrangement of a capacitor C1, a resistor R3 and a further capacitor C3. From the junction of the capacitor C1 and the resistor R3, a resistor R1 leads to the anode of a diode D3 and to the cathode of a diode D1.

The input E is connected to the reference potential through a resistor R10 and, parallel thereto, through a series arrangement of a capacitor C2, a resistor R6 and a further capacitor C4. From the junction of the capacitor C2 and the resistor R6, a resistor R2 leads to the anode of a diode D4 and to the cathode of a diode D2. The cathodes of the diodes D3 and D4 are connected to the reference potential. The anodes of the two diodes D1 and D2 are interconnected.

Four sequentially arranged resistors R7, R4, R5 and R8 lead in the order named from the junction of the resistor R3 and the capacitor C3 to the junction of the resistor R6 and a capacitor C4. Depending on the position of a change-over switch S1, which is switched either manually or remotely, a supply voltage $-U1$ is connected to either the junction of the two resistors R7 and R4 or to the junction of the two resistors R8 and R5. The junction of the two resistors R4 and R5 is, however, connected to a supply voltage $+U2$.

The two-stage transistor amplifier TV is constructed as follows.

The base of a transistor T1 is connected through a feedback resistor R11 to the emitter of a transistor T2 whose base is connected to the collector of the transistor T1. The collector of transistor T1 is connected through a resistor R12, and the collector of transistor T2 through a resistor R13, to the supply voltage $+U2$. The emitter of transistor T1 is connected through a resistor R14, and the emitter of transistor T2 through a resistor Z, to the supply voltage $-U1$. In addition, the emitter of transistor T1 is connected to the reference potential through a capacitor C5. The output signal is taken from the collector of transistor T2.

The interconnected anodes of the two diodes D1 and D2, which form part of the electronic switch EU, are connected through a resistor R15 to the base, and through a diode D5 to the emitter, of transistor T1, which forms part of the transistor amplifier TV. The anode of diode D5 is connected to the emitter of transistor T1 and its cathode is connected to the anodes of the diodes D1 and D2.

If the switch S1 is in the position BS shown in the Figure, the input B is through-connected and the input E is blocked. The operating current for the electronic selector switch EU is taken from the output stage of the transistor amplifier TV through the negative feedback resistor R11. This operating current flows from $+U2$ through the resistor R13, the collector-emitter path of transistor T2, the negative feedback resistor R11, the resistor R15, the diode D1, the resistors R1, R3 and R7 and also through the change-over switch S1 to $-U1$. Consequently, the diode D1 is driven to its low-resistance state, without additional control power being required therefor which, should it be required, should be conveyed through further components to circuit arrangement points which are critical as regards radio frequencies (RF). To ensure that the diode D3 is blocked, the potential at the base of the transistor T1 is adjusted to a value located between $-U1$ and the reference potential. When, for example, $-U1$ is 4.5 V and $+U2$ is 5 V, the diode D3 is operated at a blocking voltage of 1.8 V with a potential of $-0.8$ V at the base of transistor T1.

Consequently, no additional auxiliary voltage sources are required to produce blocking voltages for the diodes. Because of the negative feedback for radio frequencies, the base of transistor T1 represents the fictitious $R_i$-zero point of the transistor amplifier TV. ($R_i$=input resistance). The advantages accomplished thereby will be described in greater detail hereinafter.

When the change-over switch S1 is in the position BS, a current flows from $+U2$ through the resistors R5, R8, R6 and R2 and also through the diode D4 to the point which has the reference potential. Consequently, the diode D4 is in the low-resistance state, while the diode D2 is non-conductive as a blocking voltage of 1.6 V is applied to this diode for the above-mentioned values for $-U1$ ($-4.5$ V), for $+U2$ ($+5$ V) and for the potential at the base of transistor T1 ($-0.8$ V), so that also here suitable potential ratios can be set without additional components.

In order to activate the input E and to block the input B, the change-over switch S1 is switched from position BS to the position ES. The change-over can be effected either manually or remotely. Then the voltage ratios at the diodes D1, D2, D3 and D4 are inverted: now the diodes D2 and D3 conduct and the diodes D1 and D4 are non-conductive. The operating current for the electronic selector switch EU flows, as described in the foregoing, from $+U2$ to the resistor R15 and from there further to $-U1$ through the diode D2, the resistors R2, R6 and R8 and also through the change-over switch S1. The current path for the current blocking the input B is formed by the resistors R4, R7, R3 and R1 and also by the diode D3.

The inputs E and B of the electronic selector switch EU are of a similar construction. The following components are identical and have always the same values: R9 and R10, R1 and R2, R3 and R6, R7 and R8, R4 and R5, C1 and C2, C3 and C4, D1 and D2 as well as D3 and D4.

When, for example, a switch to one out of n transmission paths must be made, then n identical inputs must be arranged in parallel. The change-over switch S1 is then constructed as a change-over switch having n switching possibilities.

Irrespective of which of the two inputs B or E is blocked and which is through-connected to the transistor amplifier TV, and cables at these two inputs are always terminated by an adequately high impedance. If, for example, the input B is through-connected to the transistor amplifier TV then, for radio frequencies, the cable at the input B is connected to the reference potential through the resistor R1, the diode D1, the resistor R15 and the ficticious $R_i$-zero point of the transistor amplifier TV, and also parallel thereto through the resistor R3 and the capacitor C3. The cable at the blocked input E is connected, for radio frequencies, to the reference potential through the resistor R6 and the capacitor C4 and also parallel thereto through the resistor R2 and the diode D4. The resistor R15 which is chosen to be low-resistance, has only the function of a surge protection resistor. It is chosen that $R3 < < R1$ and $R6 < < R2$, the two cables are always terminated for radio frequencies with substantially the same resistance, as the respective junctions of the diodes D1, D3 and D2, D4 in the through-connected condition are low-impedance points in relation to resistors R1 and R2, respectively, on account of the ficticious $R_i$-zero point of the transistor amplifier TV and, in the blocked condition, are connected to the reference potential through low-resistance diodes D3 and D4, respectively. Consequently, in both cases the input resistance is fundamentally determined by the parallel arrangement of the resistors R1, R3 and R2, R6, respectively.

The high-ohmic resistors R1 and R2 are furthermore intended to provide, together with the diodes D3 and D4, a protection against positive overvoltages with respect to the reference potential so that the diodes D3 and D4, which act as switching diodes, also operate as protection diodes. To provide protection against negative overvoltages at the two inputs a protection diode, the diode D5, is sufficient, the high-ohmic resistors R1 and R2 forming, in addition, an effective current limitation.

Because the two inputs B and E are joined in the ficticious $R_i$-zero point of the transistor amplifier TV they are particularly well decoupled from each other.

The embodiment described is particularly suitable for realization in hybrid technique because of the following two reasons:

No inductances are required to feed-in control signals for the electronic selector switch EU. Because of the above-described arrangement of the diodes D1, D2, D3 and D4 at the ficticious $R_i$-zero point the RF-level across them is low.

Cross-talk at the two inputs B and E is effectively suppressed thereby, although with the dense construction in hybrid technique and stray capacitances of the diodes with their contact areas are significantly higher than those of the substrate resistances. As a result thereof high step-band attenuation is obtained also at frequencies above 200 MHz. Tuner diodes are particularly suitable for use as the diodes D1, D2, D3 and D4, as at a current of approximately 2 mA they have a forward resistance of approximately 1 Ohm, and as they excel in low reverse capacitances of approximately 1 pF at low reverse voltages.

Instead of the resistor Z a control network may alternatively be provided in the transistor amplifier TV, which network has a transfer function which is inverse to the complex frequency response of the line, to enable an automatic pulse equalization to be effected.

What is claimed is:

1. A circuit arrangement comprising an amplifier and an electronic selector switch circuit at an input of the amplifier for coupling the amplifier input to one out of a plurality of incoming transmission paths, characterized in that the operating current for the electronic selector switch circuit is taken from the output of the amplifier through a feedback resistor.

2. A circuit arrangement as claimed in claim 1, characterized in that the electronic selector switch circuit comprises respective input circuits for said incoming transmission paths, which input circuits are of an identical construction.

3. A circuit arrangement as claimed in claim 2, characterized in that the electronic selector switch circuit comprises two input circuits.

4. A circuit arrangement as claimed in claim 3, characterized in that one input circuit of the electronic selector switch circuit is connected to the other input circuit through a first series arrangement of a first resistor, first and second diodes which are poled oppositely, and a second resistor; said one input circuit being connected to said other input circuit through a second series arrangement in parallel with said first series arrangement, said second series arrangement comprising third, fourth, fifth and sixth resistors; said electronic selector switch circuit comprising a change-over switch having a first terminal connected to the junction of the third and fourth resistors and a second terminal connected to the junction of the fifth and sixth resistors, and a selector terminal connected to a first supply voltage; the junction of the fourth and fifth resistors being connected to a second supply voltage; the junction of the first resistor and the first diode being connected to a reference potential through a third diode which is poled opposite to the first diode; the junction of the second resistor and the second diode being connected to the reference potential through a fourth diode which is poled oppositely to the second diode; the interconnected identical electrodes of the first and second diodes forming the output of the electronic selector switch circuit into which the operating current is fed through the negative feedback resistors; the potential at the interconnected opposite electrodes of the first and third diodes being opposite to the potential at the interconnected opposite electrodes of the second and fourth diodes.

5. A circuit arrangement as claimed in claim 4, characterized in that a seventh resistor is arranged between the third and fourth resistors and an eighth resistor between the fifth and sixth resistors.

6. A circuit arrangement as claimed in claim 5, characterized in that a first capacitor is provided between the first resistor and a first of said transmission paths and a second capacitor is provided between the second resistor and a second of said transmission paths.

7. A circuit arrangement as claimed in claim 5 or 6, characterized in that said first transmission path is connected to the reference potential through a ninth resistor and said second transmission path is connected to the reference potential through a tenth resistor.

8. A circuit arrangement as claimed in claim 5 or 6, characterized in that the junction of the third and seventh resistors is connected to the reference potential through a third capacitor and the junction between the sixth and eighth resistors is connected to the reference potential through a fourth capacitor.

9. A circuit arrangement as claimed in claim 4, 5 or 6, characterized in that the anodes of the first and second diodes are interconnected, the first supply voltage is negative and the second supply voltage is positive with respect to the reference potential.

10. A circuit arrangement as claimed in claim 4, 5 or 6, characterized in that the change-over switch can be operated manually or remotely.

11. A circuit arrangement as claimed in claim 4, characterized in that the amplifier is a two-stage transistor amplifier having a negatively feedback over both stages, and that the interconnected electrodes of the first and second diodes are connected to the base of the input transistor of the transistor amplifier.

12. A circuit arrangement as claimed in claim 11, characterized in that the base of the input transistor of the transistor amplifier is preceded by an eleventh resistor.

* * * * *